(12) United States Patent
Liou et al.

(10) Patent No.: US 9,673,049 B2
(45) Date of Patent: Jun. 6, 2017

(54) MANUFACTURING METHOD OF PATTERNED STRUCTURE OF SEMICONDUCTOR DEVICE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/683,120

(22) Filed: Apr. 9, 2015

(65) Prior Publication Data

US 2016/0268142 A1    Sep. 15, 2016

(30) Foreign Application Priority Data

Mar. 9, 2015    (TW) .............................. 104107459 A

(51) Int. Cl.
| | |
|---|---|
| *H01L 21/311* | (2006.01) |
| *H01L 21/033* | (2006.01) |
| *H01L 21/308* | (2006.01) |

(52) U.S. Cl.
CPC ...... *H01L 21/0337* (2013.01); *H01L 21/3086* (2013.01)

(58) Field of Classification Search
CPC ......... H01L 21/31111; H01L 21/31144; H01L 21/3115; H01L 21/0338
See application file for complete search history.

(56) References Cited

U.S. PATENT DOCUMENTS

| | | | |
|---|---|---|---|
| 4,502,914 A | 3/1985 | Trumpp | |
| 4,648,937 A | 3/1987 | Ogura | |
| 5,429,988 A | 7/1995 | Huang | |
| 7,659,208 B2 | 2/2010 | Zhou | |
| 7,696,101 B2 | 4/2010 | Li | |
| 7,919,413 B2* | 4/2011 | Chen | H01L 21/0338 257/E21.249 |
| 8,026,044 B2 | 9/2011 | Lee | |
| 8,314,034 B2 | 11/2012 | Tan | |
| 8,549,458 B2 | 10/2013 | Sezginer | |
| 9,034,765 B2* | 5/2015 | Park | H01L 21/302 438/702 |

(Continued)

*Primary Examiner* — Ngan Ngo
*Assistant Examiner* — Stephen Bradley
(74) *Attorney, Agent, or Firm* — Winston Hsu; Scott Margo

(57) ABSTRACT

A manufacturing method of a patterned structure of a semiconductor device includes following steps. A plurality of support features are formed on a substrate. A first conformal spacer layer is formed on the support features and a surface of the substrate, a second conformal spacer layer is formed on the first conformal spacer layer, and a covering layer is formed on the second conformal spacer layer. A gap between the support features is filled with the first conformal spacer layer, the second conformal spacer layer, and the covering layer. A first process is performed to remove a part of the covering layer, the second conformal spacer layer, and the first conformal spacer layer. A second process is performed to remove the support features or the first conformal spacer layer between the support feature and the second conformal spacer layer to expose a part of the surface of the substrate.

13 Claims, 15 Drawing Sheets

(56) References Cited

U.S. PATENT DOCUMENTS

| | | | |
|---|---|---|---|
| 2007/0148968 A1* | 6/2007 | Kwon | H01L 21/0337 438/671 |
| 2007/0287299 A1* | 12/2007 | Lee | H01L 21/0337 438/761 |
| 2008/0200026 A1* | 8/2008 | Koh | H01L 21/0337 438/643 |
| 2012/0205750 A1* | 8/2012 | Sudo | H01L 21/0337 257/379 |
| 2015/0118850 A1* | 4/2015 | Peng | H01L 21/0337 438/703 |

* cited by examiner

MANUFACTURING METHOD OF PATTERNED STRUCTURE OF SEMICONDUCTOR DEVICE

BACKGROUND OF THE INVENTION

1. Field of the Invention

The present invention relates to a manufacturing method of a patterned structure of a semiconductor device, and more particularly, to a manufacturing method using multiple and stacked conformal spacer layer to increase the pattern density of the patterned structure in the semiconductor device.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. However, photolithography technology is used to form patterned structures in general semiconductor manufacturing processes. The size and the spacing between the patterned structures are limited by the exposure resolution minimum of the photolithography technology and hard to be further shrunk, and that becomes a bottleneck issue of the semiconductor technology. The sidewall image transfer (SIT) technology has be provided by the related industries for transferring patterns of the sidewall with size smaller than the exposure resolution minimum of the photolithography technology. However, it is still hard to manufacturing patterned structures with extremely small size and spacing and further higher pattern density.

SUMMARY OF THE INVENTION

It is one of the objectives of the present invention to provide a manufacturing method of patterned structure of a semiconductor device. Multiple stacked layers of conformal spacer layers and a covering layer are formed on support features and a substrate, and corresponding etching processes are applied to form a mask pattern with a pattern density higher than that of the original support features.

A manufacturing method of a patterned structure of a semiconductor device is provided in an embodiment of the present invention. The manufacturing method includes following steps. A plurality of support features are formed on a surface of a substrate. Two adjacent support features are isolated from each other by a gap. A first conformal spacer layer is formed on the support features and the surface of the substrate. A second conformal spacer layer is then formed on the first conformal spacer layer. A covering layer is then formed on the second conformal spacer layer. The gap between the support features is filled with the first conformal spacer layer, the second conformal spacer layer, and the covering layer. The covering layer in the gap does not contact the surface of the substrate. After the step of forming the covering layer, a first process is performed to remove apart of the covering layer, apart of the second conformal spacer layer, and a part of the first conformal spacer layer so as to expose a part of the support features, a part of the first conformal spacer layer, and a part of the second conformal spacer layer. A second process is then performed to remove the support features or the first conformal spacer layer between the support feature and the second conformal spacer layer so as to expose a part of the surface of the substrate.

In the manufacturing method of the patterned structure of the semiconductor device, the multiple layers of the conformal spacer layers and the covering layer are stacked and formed on the support features and the substrate, and a mask pattern with a pattern density higher than that of the original support features is formed by removing a part of the support features or/and a part of the conformal spacer layers. The mask pattern may be used to form a patterned structure with high pattern density which may not be realized because of the resolution limitation of the original photolithography technology.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
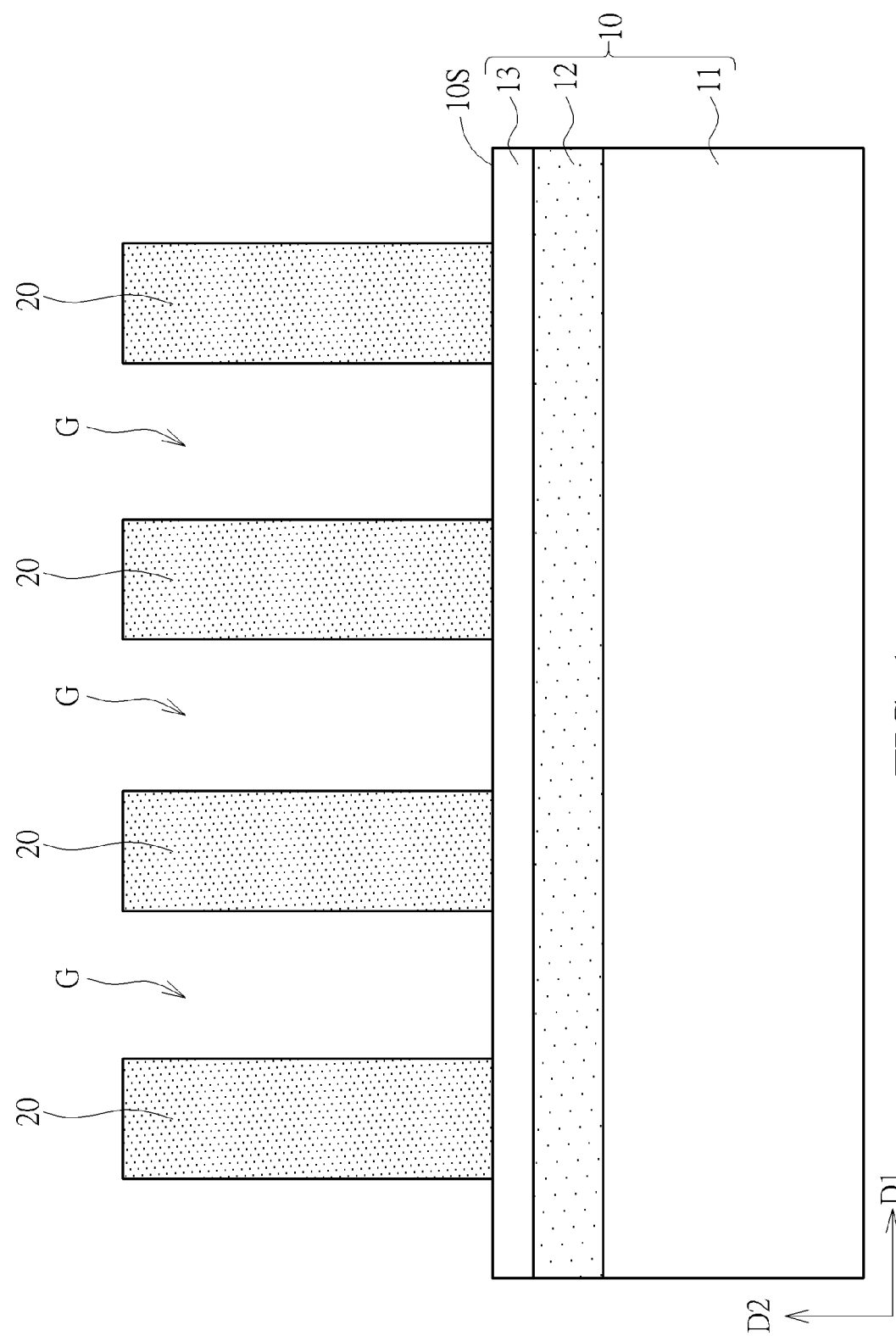
FIGS. 1-9 are schematic drawings illustrating a manufacturing method of a patterned structure of a semiconductor device according to a first embodiment of the present invention.

Please refer to FIGS. 1-9. FIGS. 1-9 are schematic drawings illustrating a manufacturing method of a patterned structure of a semiconductor device according to a first embodiment of the present invention. The manufacturing method of the patterned structure of the semiconductor device in this embodiment includes the following steps. As shown in FIG. 1, a plurality of support features 20 are formed on a surface 10S of a substrate 10. The support features 20 are repeatedly disposed in a horizontal direction D1, and two adjacent support features in the horizontal direction D1 are separated from each other by a gap G. The support features 20 may be formed by the conventional photolithography process, and a width of the support feature 20 in the horizontal direction D1 may be close to the resolution limitation (resolution minimum) of the exposure process in the photolithography technology, but the present invention is not limited to this. In other embodiments of the present invention, the support features 20 may also be manufactured by other manufacturing processes such as the double patterning technology or the sidewall image transfer (SIT) technology according to different considerations. In addition, the substrate 10 may include a semiconductor substrate 11, a bottom mask layer 12, and an etching stop layer 13 sequentially stacked in a vertical direction D2, and the surface 10S may be an upper surface of the etching stop layer 13, but the present invention is not limited to this. In other embodiments of the present invention, the substrate 10 of other structures may also be used. The material of the etching stop layer 13 is selected from materials capable of resisting the etching process for forming the support features 20 and the other subsequent etching processes preferably. For example, when the material of the support feature 20 is carbon, the material of the etching stop layer 13 may be silicon or silicon oxide, but not limited thereto. The support features 20 may also be made of other materials such as silicon, silicon oxide, or silicon nitride, and the etching stop layer 13 may be made of other appropriate materials to be coordinated with the support features 20. In addition, the bottom mask layer 12 and the support features 20 may be made of the same material, and the semiconductor substrate 11 may include an epitaxial silicon substrate, a silicon germanium substrate, a silicon carbide substrate, or a silicon-on-insulator (SOI) substrate, but not limited thereto.

Figure 2:
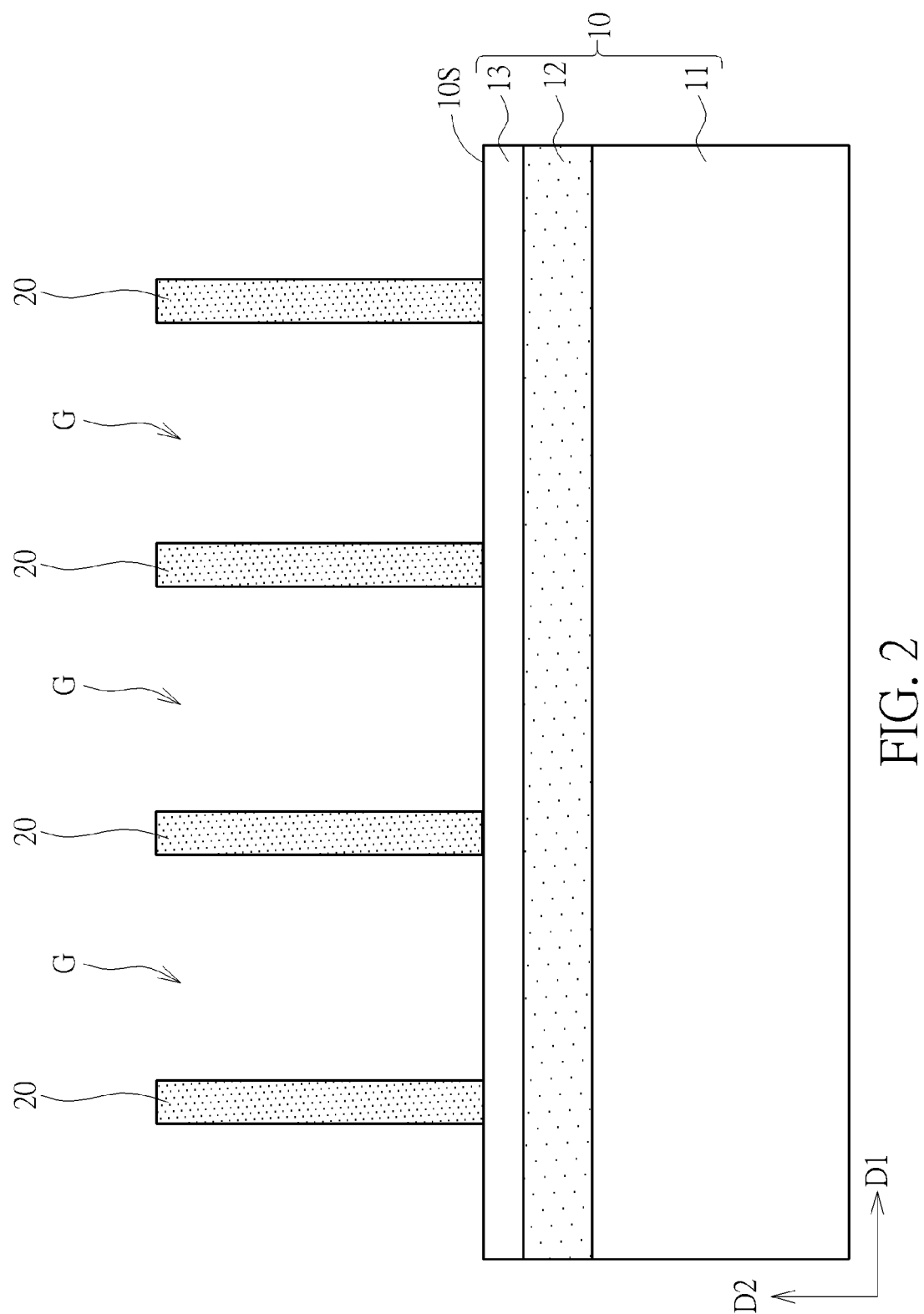
Figure 3:
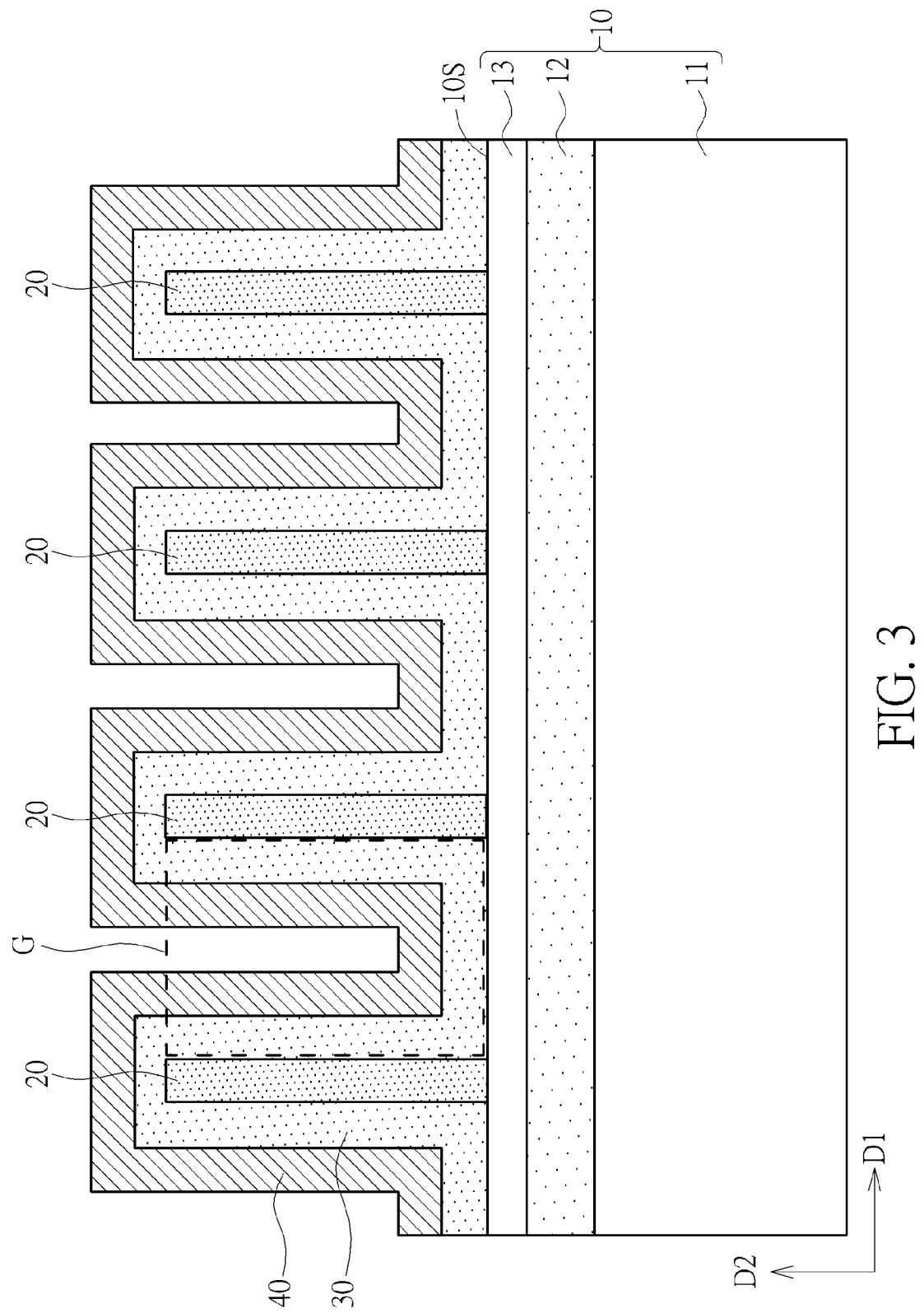

As shown in FIG. 2, a trimming process configured to reduce a size of each of the support features 20 may be selectively applied in the manufacturing method of this embodiment. The trimming process may include an appropriate dry or wet etching process according to the material of the support features 20, but not limited thereto. As shown in FIG. 3, after the trimming process mentioned above, a first conformal spacer layer 30 is conformally formed on the support features 20 and the surface 10S of the substrate 10. In other words, the first conformal spacer layer 30 is not a planarization layer, and the condition of the topography after the step of forming the first conformal spacer layer is substantially similar to the condition of the topography formed by the surface 10S of the substrate 10 and the support features 20 before the step of forming the first conformal spacer layer 30. A thickness of the first conformal spacer layer 30 on the surface 10S is substantially equal to a thickness of the first conformal spacer layer 30 formed on two lateral sides of each support feature 20 in the horizontal direction D1. Subsequently, a second conformal spacer layer 40 is then formed on the first conformal spacer layer 30. The second conformal spacer layer 40 is not a planarization layer also. A thickness of the second conformal spacer layer 40 in the vertical direction D2 is substantially equal to a thickness of the second conformal spacer layer 40 formed on the two lateral sides of each support feature 20 in the horizontal direction D1. The first conformal spacer layer 30 and the second conformal spacer layer 40 are formed in the gaps G, but the gaps are not filled with the first conformal spacer layer 30 and the second conformal spacer layer 40. Additionally, the first conformal spacer layer 30 and the second conformal spacer layer 40 may be formed by appropriate manufacturing methods such as chemical vapor deposition (CVD) respectively, and the thickness of the first conformal spacer layer 30 is equal to the thickness of the second conformal spacer layer 40 preferably, but not limited thereto. The material of the first conformal spacer layer 30 is different from the material of the second conformal spacer layer 40, and the etching selectivity of the material in the first conformal spacer layer 30 is also different from the etching selectivity of the material in the second conformal spacer layer 40 preferably. For instance, when the first conformal spacer layer 30 is made of tetraethoxy silane (TEOS), the second conformal spacer layer 40 may be made of materials capable of resisting the etching process of TEOS, such as polymer materials, but not limited thereto.

Figure 4:
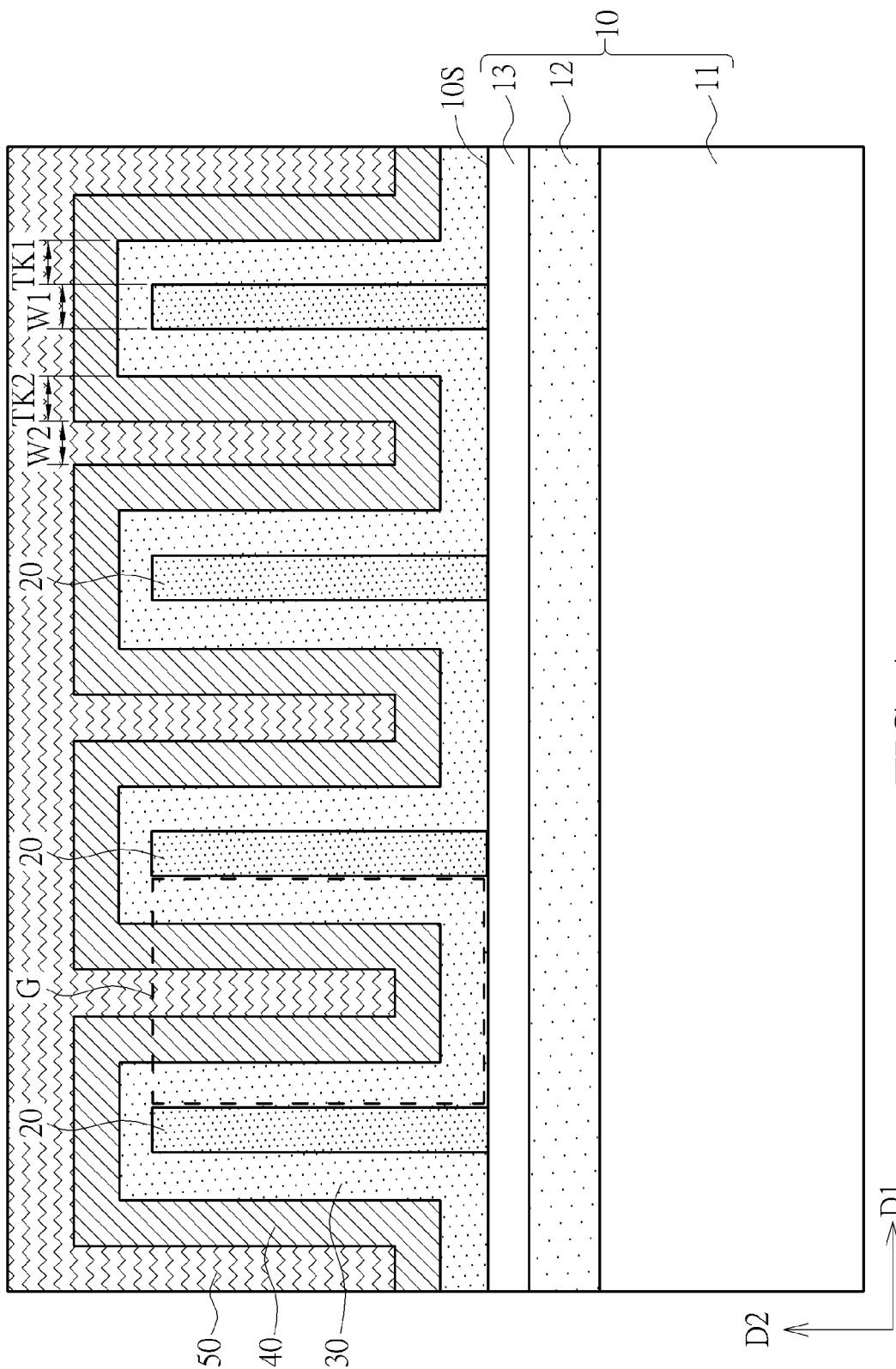

As shown in FIG. 4, a covering layer 50 is then formed on the second conformal spacer layer 40. The covering layer 50 may be materials with better gap fill ability preferably, such as photoresist, bottom anti-reflection coating (BARC), or organic dielectric layer (ODL) formed by spin-on coating, so as to ensure the filling condition of the covering layer 50 in the gaps G, but not limited thereto. The gaps G between the support features 20 are filled with the first conformal spacer layer 30, the second conformal spacer layer 40, and the covering layer 50. The covering layer 50 in the gap G does not contact the surface 10S of the substrate 10. The gaps G between the support features 20 are filled with the first conformal spacer layer 30, the second conformal spacer layer 40, and the covering layer 50 in a stacked configuration. In the horizontal direction D1, a width of each support feature 20, a width of the covering layer 50 in the gap, a thickness of the first conformal spacer layer 30 in an upper part of the gap G, and a thickness of the second conformal spacer layer 40 in the upper part of the gap G are equal to one another preferably, so as to form the required patterned mask by removing a part of the material layers in the subsequent processes, but not limited thereto. For example, each of the support features 20 may have a first width W1 in the horizontal direction D1, the covering layer 50 in the gap G may have a second width W2 in the horizontal direction D1, the first conformal spacer layer 30 may have a first thickness TK1, and the second conformal spacer layer 40 may have a second thickness TK2. The first width W1, the second width W2, the first thickness TK1, and the second thickness TK2 may be equal to one another, and a pitch of the support features 20 in the horizontal direction D1 may be equal to six times the width of each support feature 20 preferably, but not limited thereto. In other embodiments of the present invention, the first width W1, the second width W2, the first thickness TK1, and the second thickness TK2 may be different from one another, or only some of them are equal so as to formed the demanded patterned mask.

Figure 5:
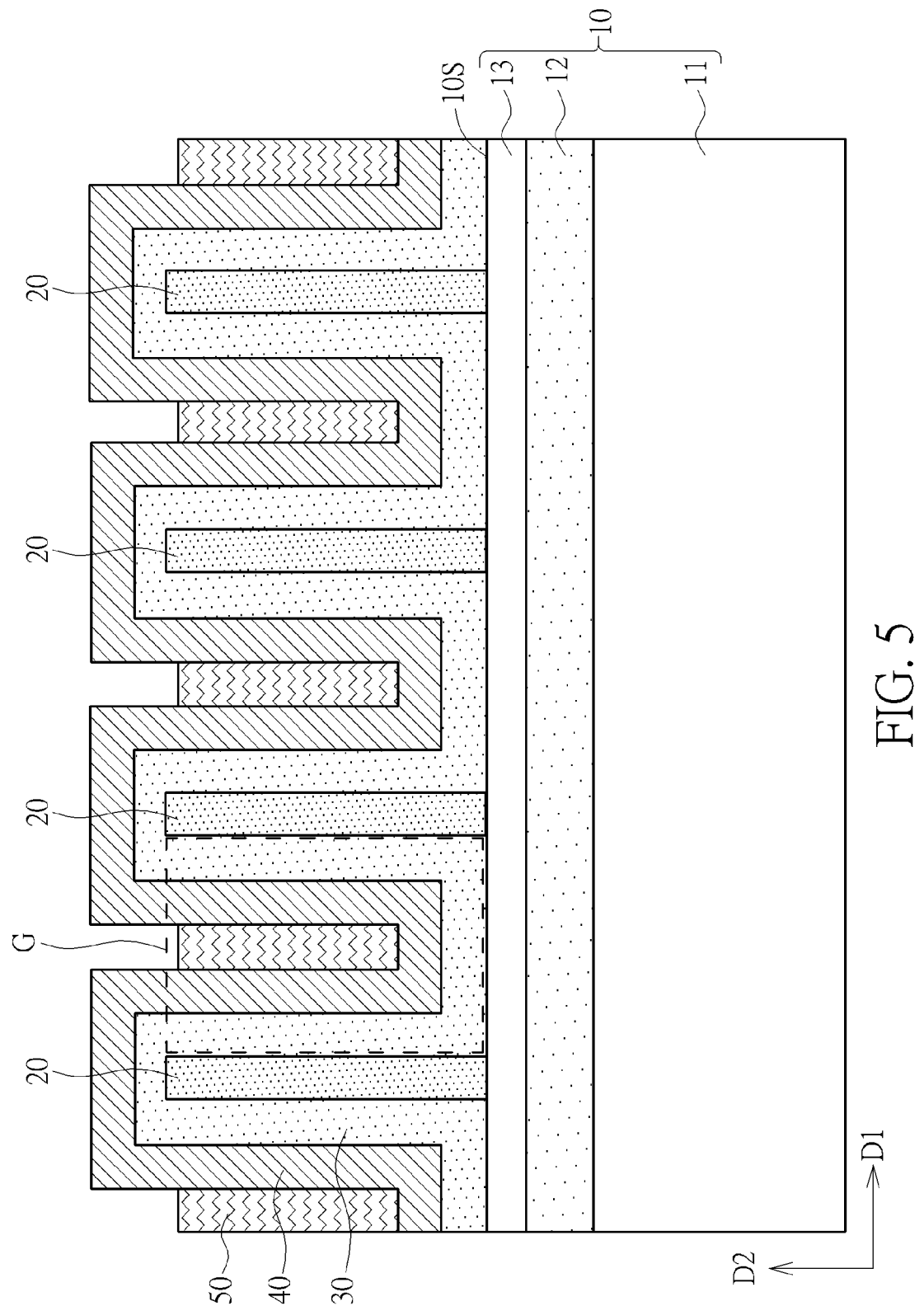
Figure 6:
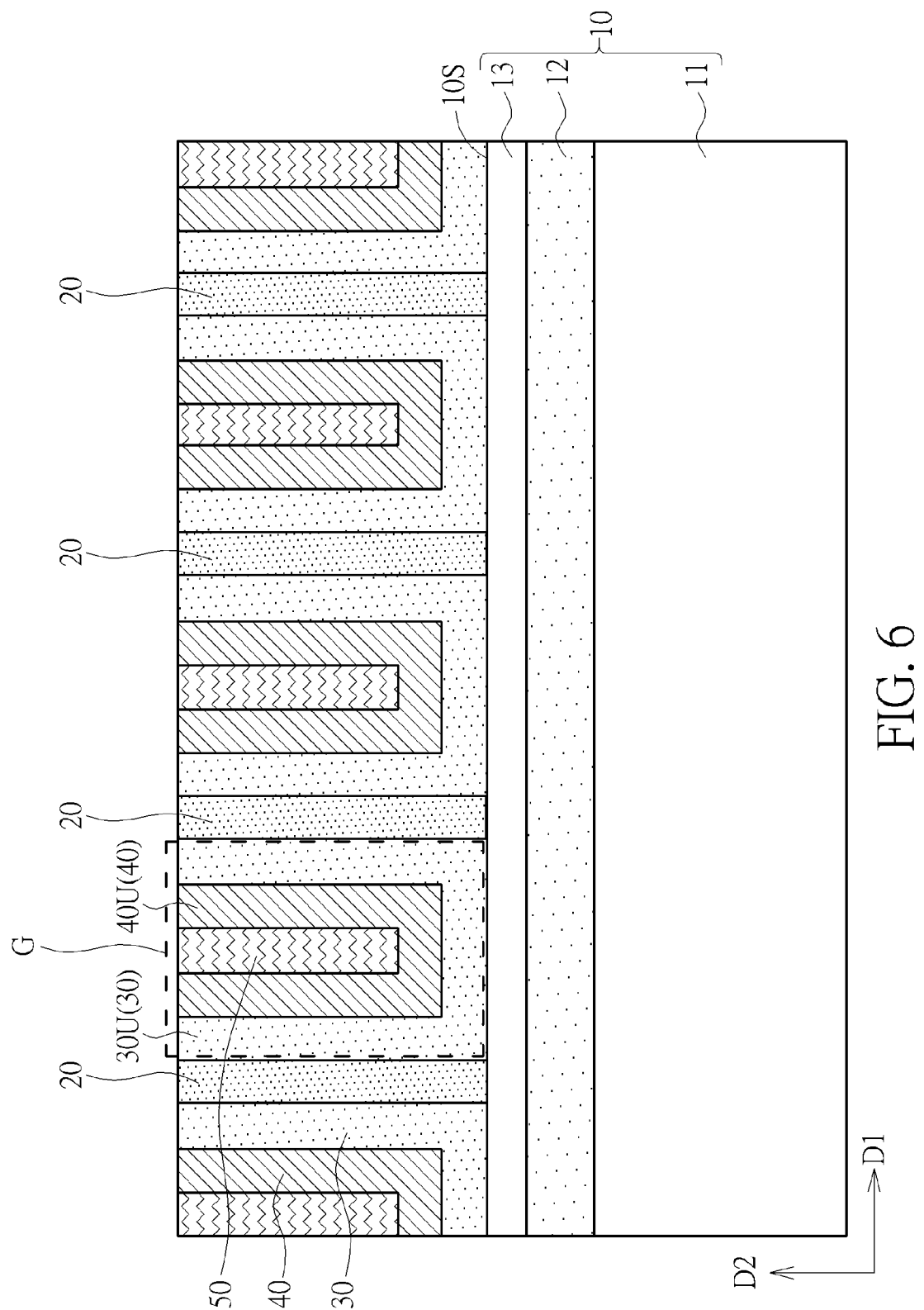

As shown in FIG. 5 and FIG. 6, after the step of forming the covering layer 50, a first process is performed to remove a part of the covering layer 50, a part of the second conformal spacer layer 40, and a part of the first conformal spacer layer 30 so as to expose apart of the support features 20, apart of the first conformal spacer layer 30, and a part of the second conformal spacer layer 40. The first process may include an etching process or/and a chemical mechanical polishing (CMP) process, but the present invention is not limited to this and other appropriate methods may also be applied to remove a part of the covering layer 50, a part of the second conformal spacer layer 40, and a part of the first conformal spacer layer 30. For example, as shown in FIG. 5, the first process in this embodiment may include an etching back process on the covering layer 50 for removing a part of the covering layer 50 and exposing a part of the second conformal spacer layer 40. Subsequently, as shown in FIG. 6, a chemical mechanical polishing process is then performed to remove a part of the covering layer 50, a part of the second conformal spacer layer 40, and a part of the first conformal spacer layer 30, so as to expose the support features 20, the first conformal space layer 30, and the second conformal spacer layer 40. After the first process, the first conformal spacer layer 30 in the gap G may become a first U-shaped spacer layer 30U, the second conformal spacer layer 40 in the gap G may become a second U-shaped spacer layer 40U, and the second U-shaped spacer layer 40U is formed between the covering layer 50 and the first U-shaped spacer layer 30U in the gap G.

Figure 7:
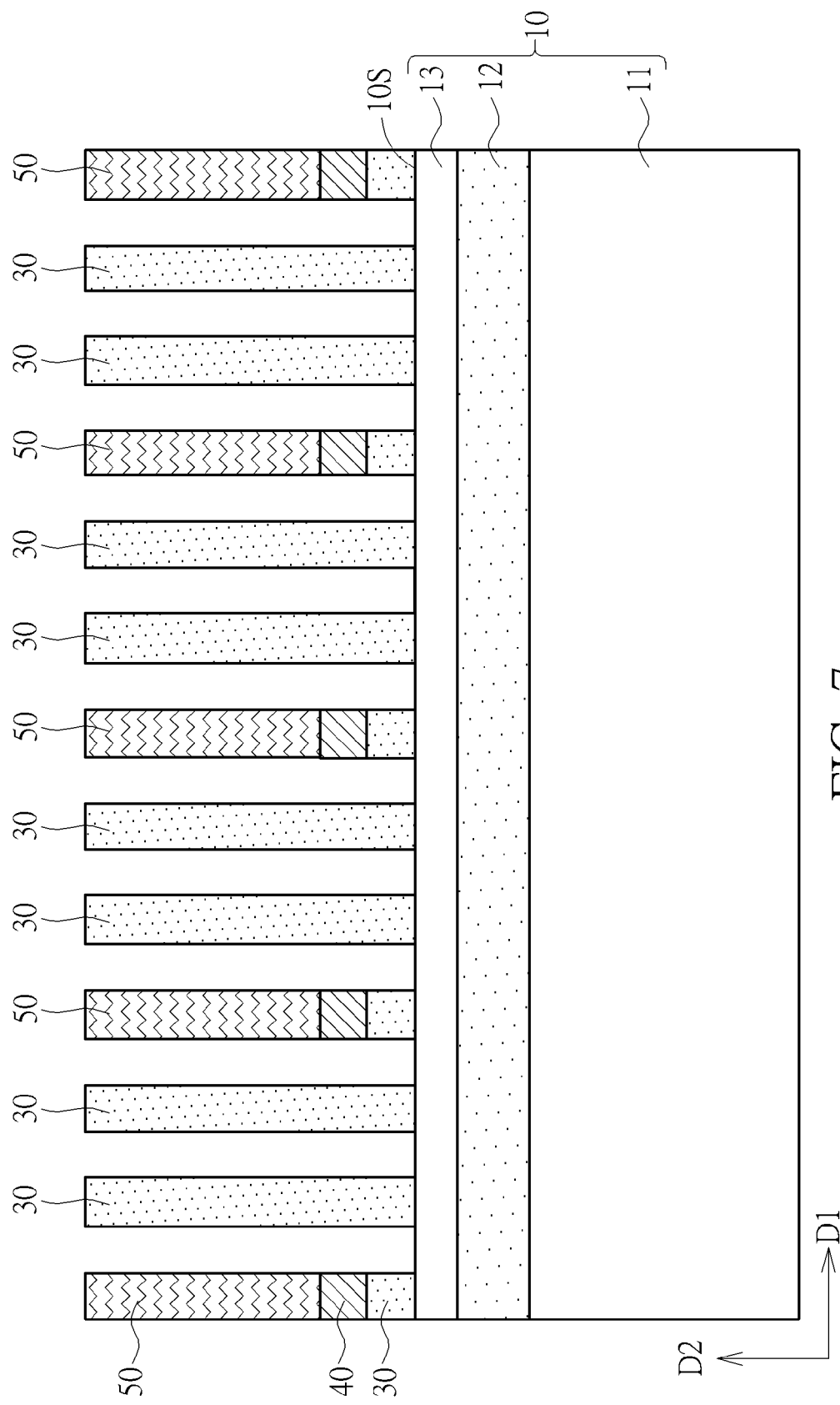

As shown in FIG. 6 and FIG. 7, a second process is then performed after the first process. The second process is configured to remove the support features 20, a part of the second conformal spacer layer 40 and a part of the first conformal spacer layer 30 between the second conformal spacer layer 40 and the substrate 10 in the vertical direction D2 and expose a part of the surface 10S of the substrate 10. The second process in this embodiment may include one or more different etching processes for etching the materials of the support features 20, the second conformal spacer layer 40, and the first conformal spacer layer 30 respectively. After the second process, a part of the first conformal spacer layer 30 and a part of the second conformal spacer layer 40 are remained between the covering layer 50 and the substrate 10 in the vertical direction D2 so as to keep the required part of the covering layer 50 from being removed by the removal of the materials underneath the covering layer 50. Therefore, the etching processed configured to remove a part of the first conformal spacer layer 30 and a part of the second conformal spacer layer 40 respectively are anisotropic etching processes preferably, but not limited thereto. It is worth noting that the remained pattern after the second process may have equal width and equal spacing in the horizontal direction D1 by controlling the thicknesses of the first conformal spacer layer 30 and the second conformal spacer layer 40, and the pattern density of the remained pattern after the second process may be triple the distribution pattern density of original support features 20, but not limited thereto. In other embodiments of the present invention, the thicknesses of the first conformal spacer layer 30 and the second conformal spacer layer 40 may be further modified for forming the remained pattern after the second process with different widths or/and different spacing.

Figure 8:
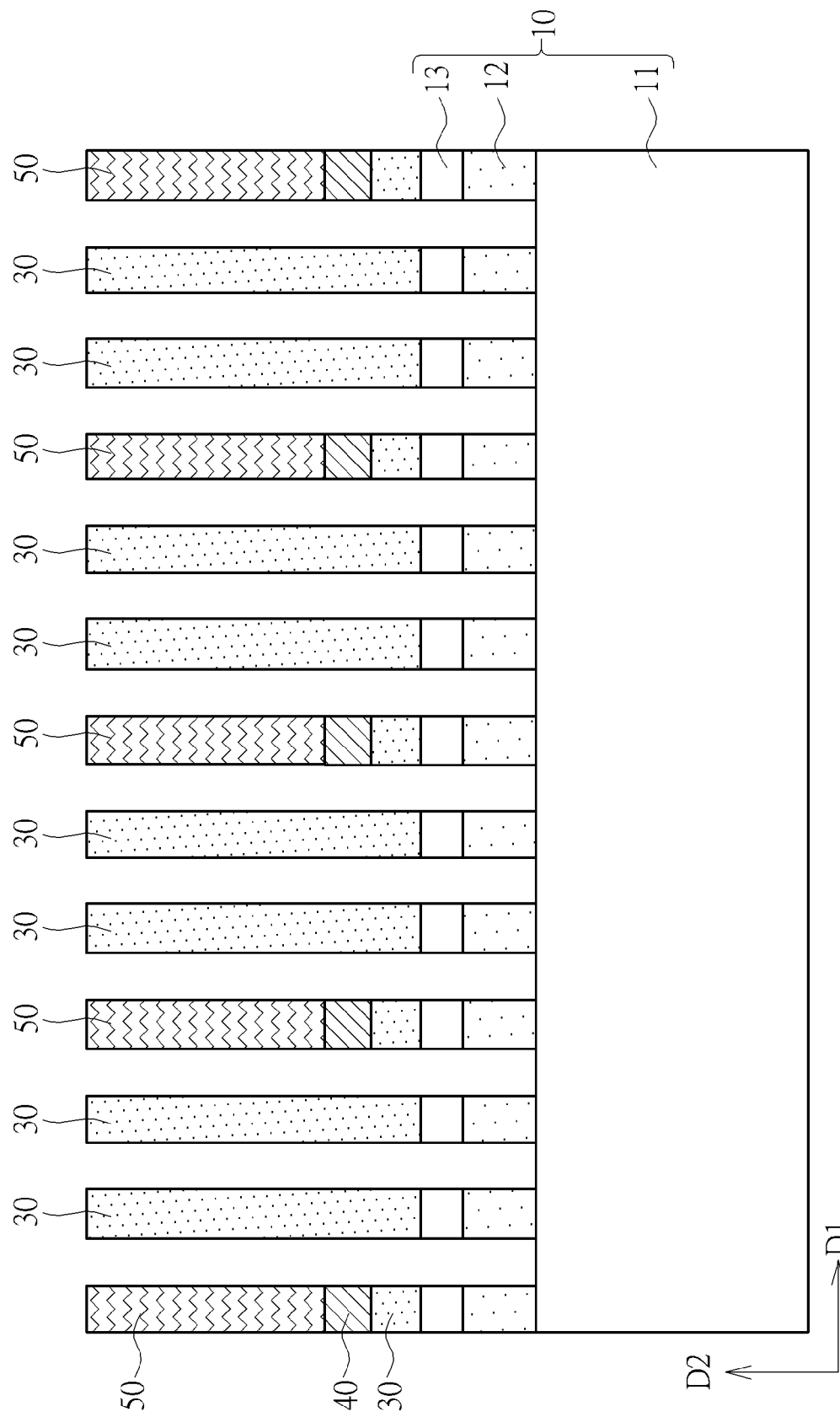
Figure 9:
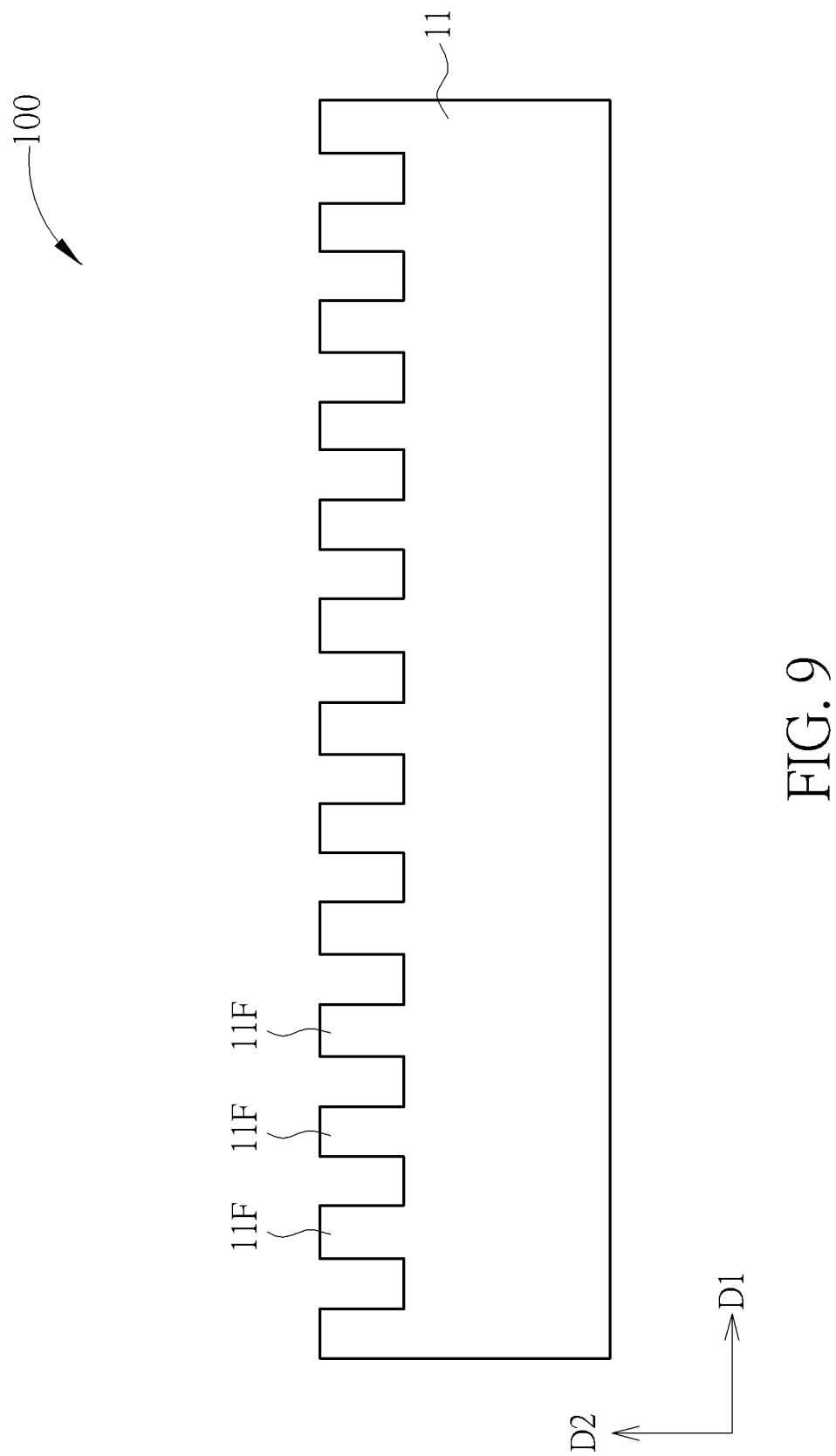

As shown in FIG. 7 and FIG. 8, after the second process mentioned above, the manufacturing method in this embodiment may further include another etching process toward the substrate 10 by using the remained first conformal spacer layer 30, the remained covering layer 50 and the remained second conformal spacer layer 40 between the covering layer 50 and the substrate 10 in the vertical direction D2 as a mask. In other words, the pattern of the remained material layers after the second process may be transfer to the bottom mask layer 12, and the bottom mask layer 12 may then be used as an etching mask for patterning the semiconductor substrate 10 and forming a patterned structure 100 of a semiconductor device as shown in FIG. 9, but not limited thereto. In other embodiments of the present invention, the object to be patterned or the target layer may also be etched without the bottom mask layer 12 as an etching mask described above, and the bottom mask layer 12 may not be required accordingly. The patterned structure 100 may include a plurality of fin structures 11F, and the fin structures 11F may be used to form fin field effect transistors (FinFETs), but not limited thereto. In other words, by using the manufacturing method of this embodiment, the pattern density may be enhanced to be equal to about triple the original pattern density limited by the conventional photolithography process, and patterned structures with higher pattern density may be manufactured and realized accordingly. In other embodiments of the present invention, the patterned structure 100 may also include other structures such as gate structures, or the patterned structure 100 may be apply in another sidewall image transfer (SIT) process for further enhance the pattern density according to other design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
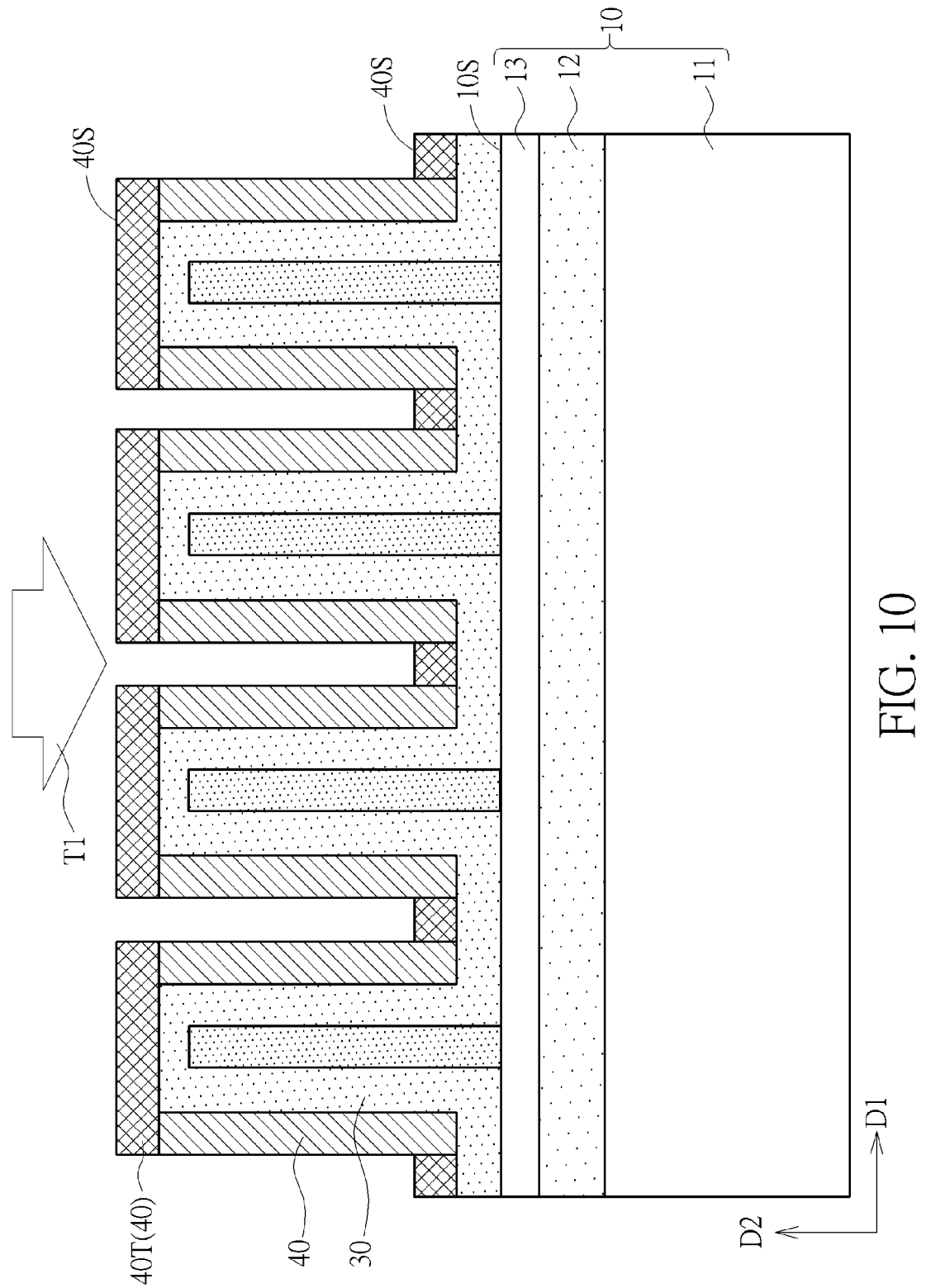
FIG. 10 and FIG. 11 are schematic drawings illustrating a manufacturing method of a patterned structure of a semiconductor device according to a second embodiment of the present invention.
Figure 11:
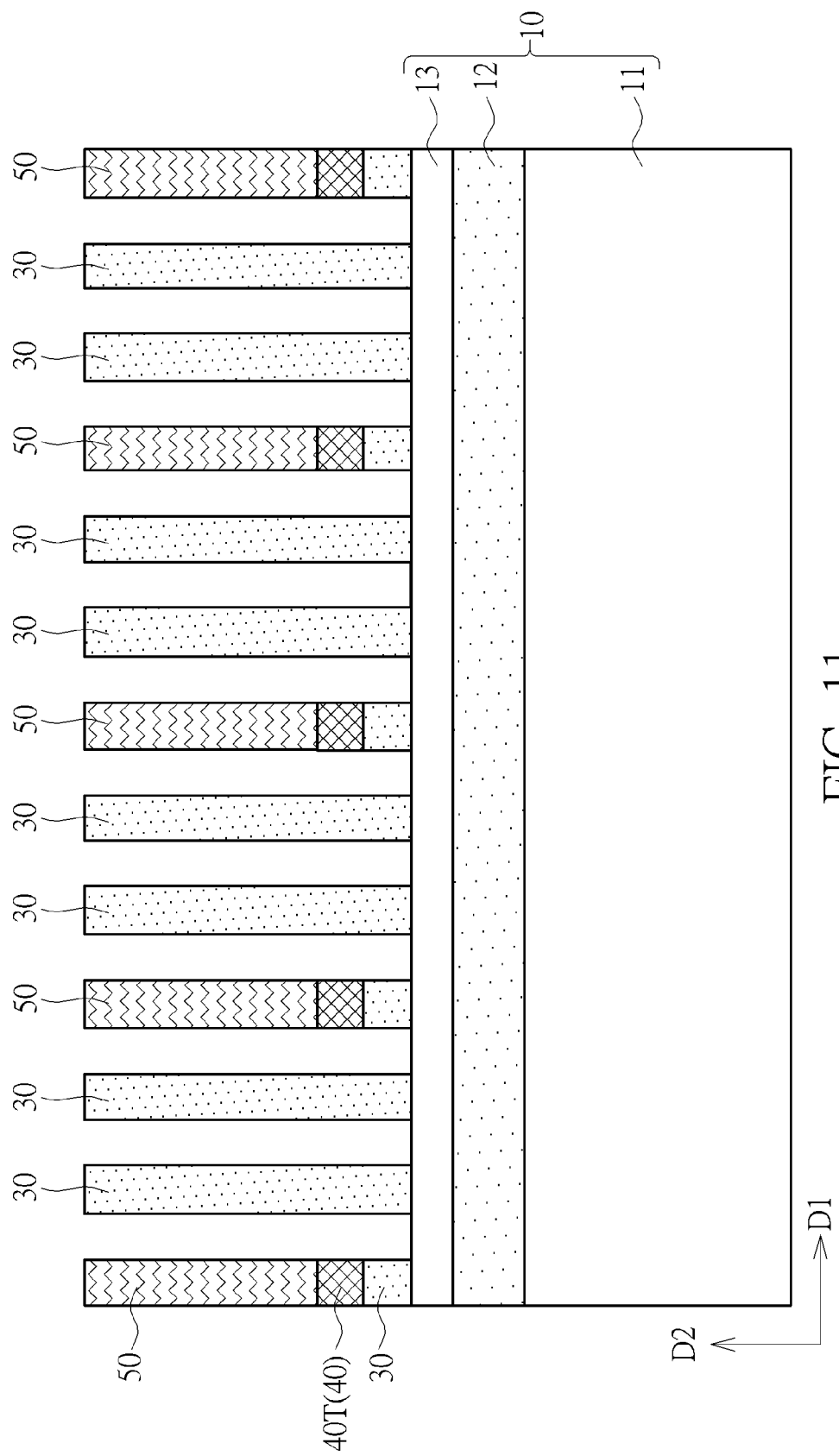

Please refer to FIG. 10 and FIG. 11. FIG. 10 and FIG. 11 are schematic drawings illustrating a manufacturing method of a patterned structure of a semiconductor device according to a second embodiment of the present invention. As shown in FIG. 10, the difference between this embodiment and the first embodiment mentioned above is that the manufacturing method in this embodiment further includes performing a first treatment T1 on an upper surface 40S of horizontal parts of the second conformal spacer layer 40 before the step of forming the covering layer 50, so as to form a plurality of first treated regions 40T in the second conformal spacer layer 40. The first treatment T1 may include a thermal treatment, a plasma treatment, a doping treatment, or other appropriate treatments, and the first treatment T1 is configured to change material properties of the second conformal spacer layer 40 within the first treated regions 40T. Accordingly, in the subsequent second process, an etching rate of the first treated region 40T in the second conformal spacer layer 40 is lower than an etching rate of the other parts of the second conformal spacer layer 40. Therefore, as shown in FIG. 11, apart of the first treated region 40T is remained between the covering layer 50 and the substrate 10 in the vertical direction after the second process, and the required part of the covering layer 50 may not be removed by the removal of the second conformal spacer layer 40 underneath the covering layer 50.

Figure 12:
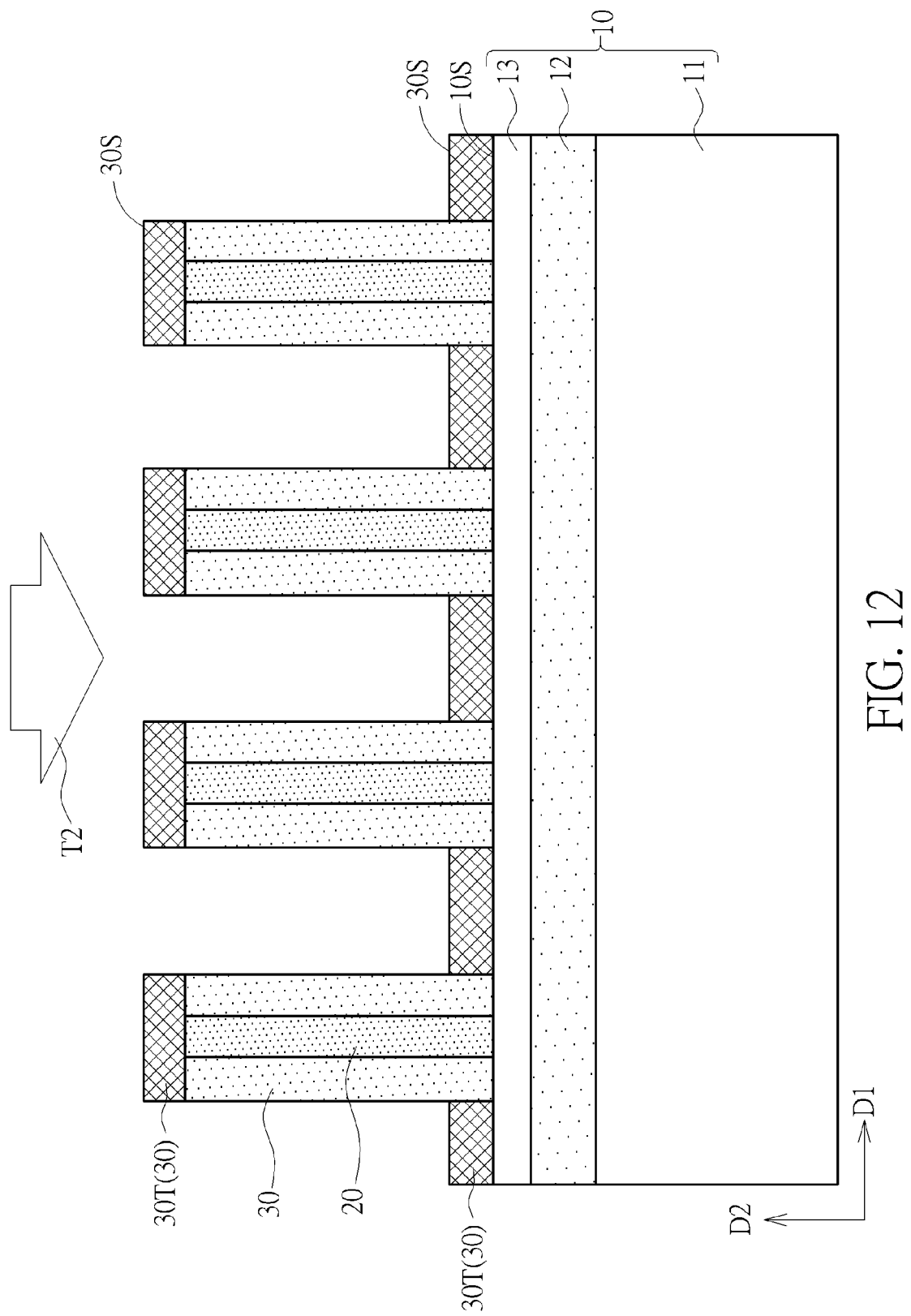
FIGS. 12-15 are schematic drawings illustrating a manufacturing method of a patterned structure of a semiconductor device according to a third embodiment of the present invention.
Figure 13:
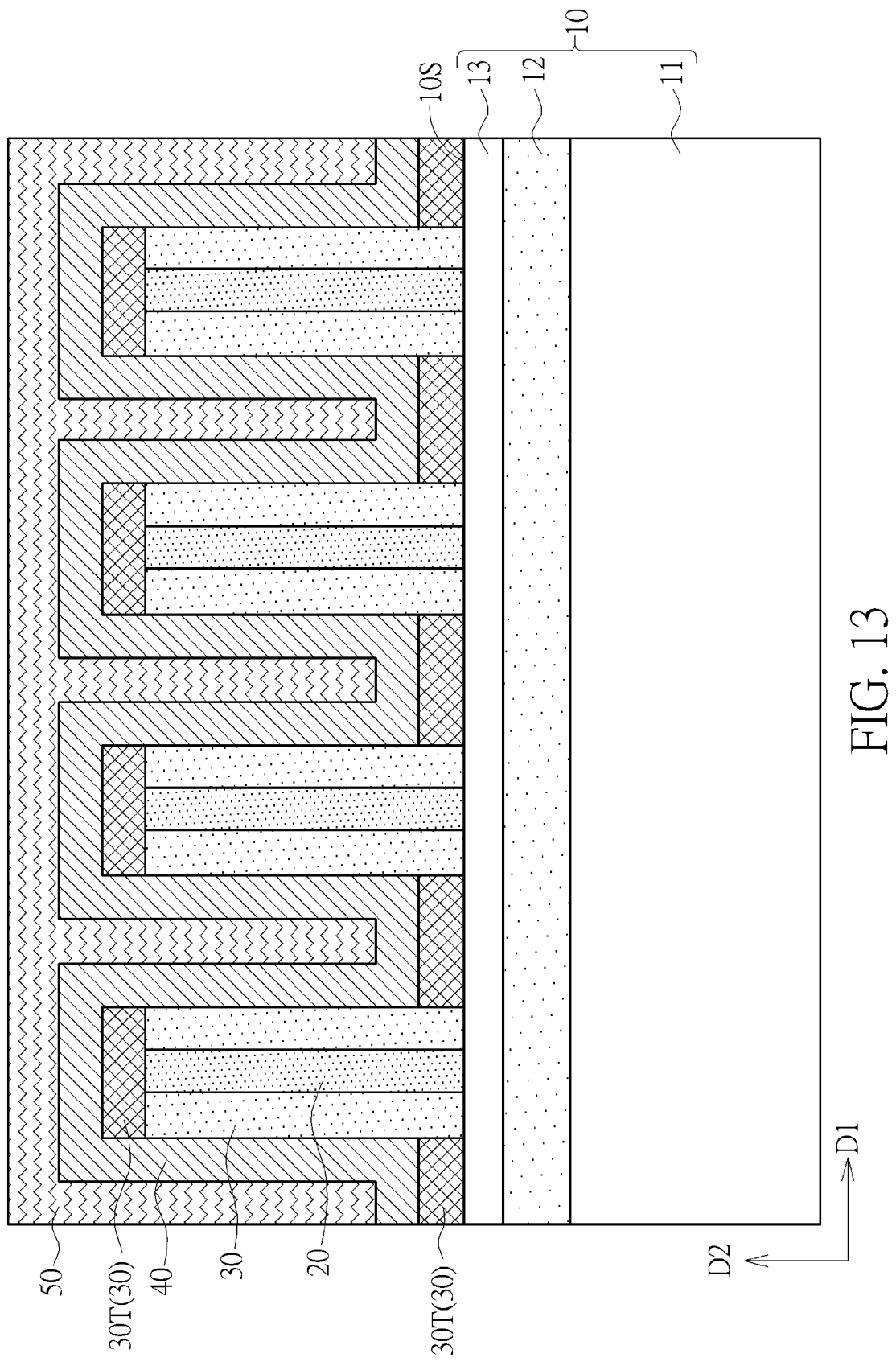

Please refer to FIGS. 12-15. FIGS. 12-15 are schematic drawings illustrating a manufacturing method of a patterned structure of a semiconductor device according to a third embodiment of the present invention. As shown in FIG. 12 and FIG. 13, the difference between this embodiment and the first embodiment mentioned above is that, in this embodiment, a second treatment T2 is performed on an upper surface 30S of horizontal parts of the first conformal spacer layer 30 before the step of forming the second conformal spacer layer 40, so as to form a plurality of second treated regions 30T in the first conformal spacer layer 30. The second conformal spacer layer 40 and the covering layer 50 are then formed sequentially after the second treatment T2. Similarly, the second treatment T2 may include a thermal treatment, a plasma treatment, a doping treatment, or other appropriate treatments, and the second treatment T2 is configured to change material properties of the first conformal spacer layer 30 within the second treated regions 30T. Accordingly, in the subsequent second process, an etching rate of the second treated region 30T in the first conformal spacer layer 30 is lower than an etching rate of the other parts of the first conformal spacer layer 30. Additionally, one of the first treatment T1 on the second conformal spacer layer 40 or the second treatment T2 on the first conformal spacer layer 30, or both of them may be performed.

Figure 14:
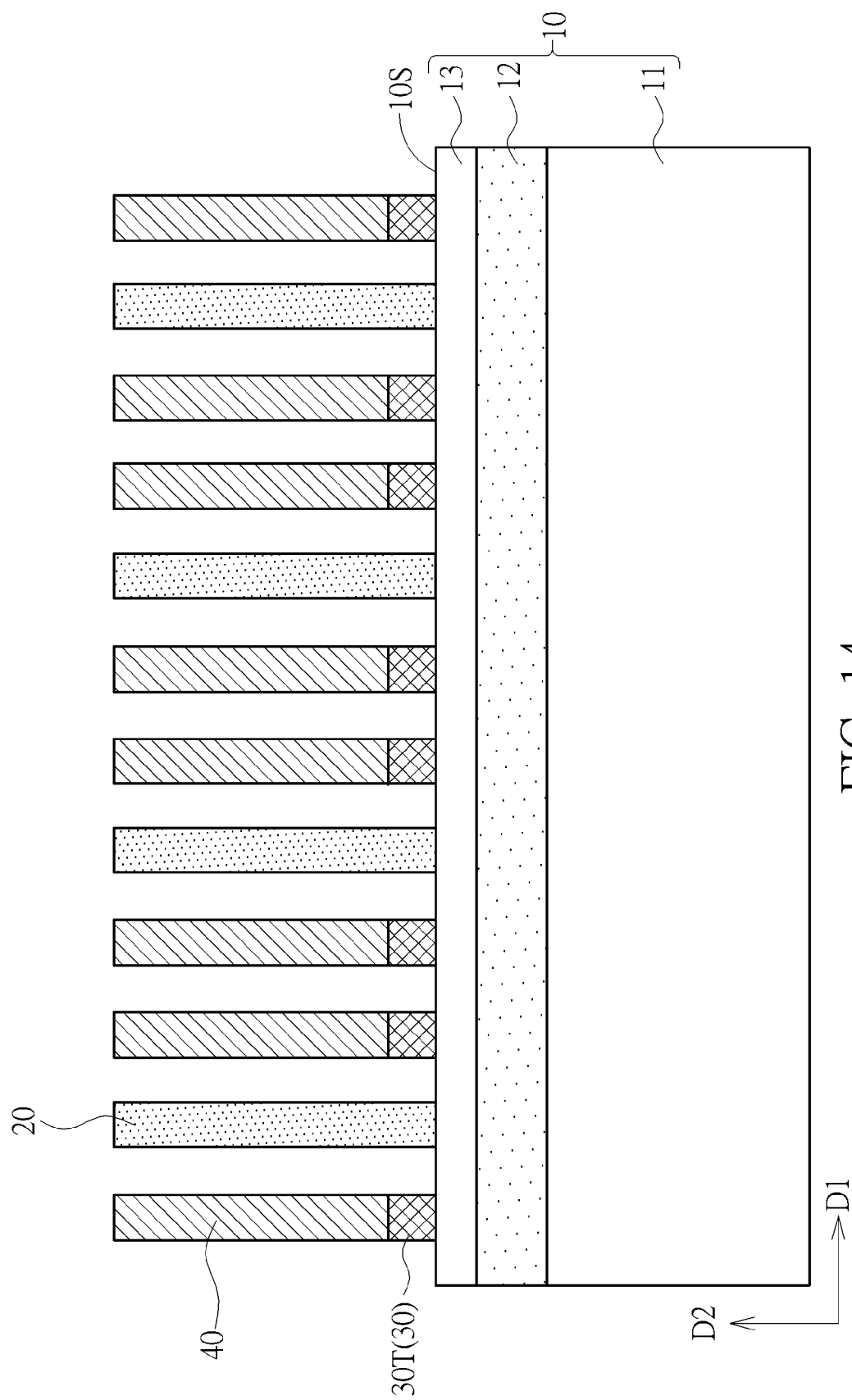

In addition, as shown in FIG. 13 and FIG. 14, the difference between this embodiment and the first embodiment mentioned above is that, in this embodiment, the second process is configured to remove the covering layer 50, the first conformal spacer layer 30 between the second conformal spacer layer 40 and the support features 20, the first conformal spacer layer 30 between the covering layer 50 and the substrate 10 in the vertical direction D2, and the second conformal spacer layer 40 between the covering layer 50 and the substrate 10 in the vertical direction D2, so as to expose a part of the surface 10S of the substrate 10 as shown in FIG. 14. After the second process, a part of the first conformal spacer layer 30 is remained between the second conformal spacer layer 40 and the substrate 10 in the vertical direction D2. In this embodiment, apart of the second treated region 30T is remained between the second conformal spacer layer 40 and the substrate 10 in the vertical direction D2 after the second process so as to keep the required part of the second conformal spacer layer 40 from being removed by the removal of the first conformal spacer layer 30 underneath the second conformal spacer layer 40 in the second process.

Figure 15:
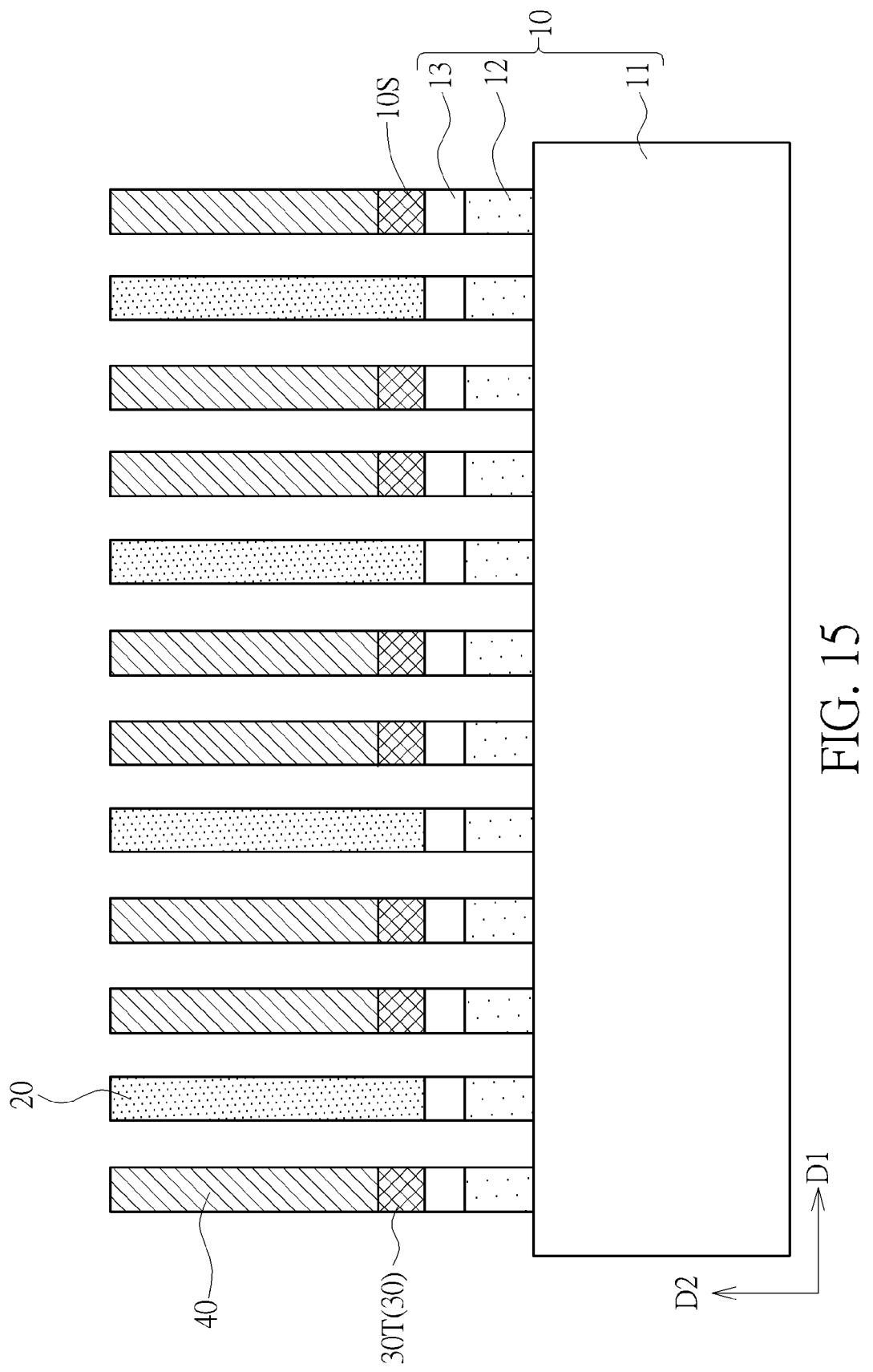

As shown in FIG. 15, after the second process mentioned above, the manufacturing method in this embodiment may further include another etching process toward the substrate 10 by using the support features 20, the remained second conformal spacer layer 40, and the remained first conformal spacer layer 30 between the second conformal spacer layer 40 and the substrate 10 in the vertical direction D2 as a mask, so as to form a patterned structure of a semiconductor device.

To summarize the above descriptions, in the manufacturing method of the patterned structure of the semiconductor device, multiple stacked layers of the conformal spacer layers and the covering layer are formed on the substrate and the support features formed by a photolithography process, and corresponding etching processes are applied to form the mask pattern with a pattern density higher than that of the original support features by removing the support features or/and a part of the conformal spacer layer. Therefore, the manufacturing method in the present invention may be used to form patterned structures with high pattern density which cannot be manufactured because of the resolution limitation of the original photolithography technology. Additionally, the etching rate of some specific regions in the conformal spacer layer is modified by the treatment in the present invention, the required patterned mask may be ensured, and the manufacturing yield may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a patterned structure of a semiconductor device, comprising:
   forming a plurality of support features on a surface of a substrate, wherein two adjacent support features are isolated from each other by a gap;
   forming a first conformal spacer layer on the support features and the surface of the substrate;
   forming a second conformal spacer layer on the first conformal spacer layer;
   forming a covering layer on the second conformal spacer layer, wherein the gap between the support features is filled with the first conformal spacer layer, the second conformal spacer layer, and the covering layer, and the covering layer in the gap does not contact the surface of the substrate;
   after the step of forming the covering layer, performing a first process removing a part of the covering layer, a part of the second conformal spacer layer, and a part of the first conformal spacer layer so as to expose a part of the support features, a part of the first conformal spacer layer, and a part of the second conformal spacer layer; and
   performing a second process configured to remove the support features so as to expose a part of the surface of the substrate, wherein a part of the second conformal spacer layer and a part of the first conformal spacer layer which are vertically stacked and disposed in an interval between the support feature and the covering layer remain before the second process, and the support features, the part of the second conformal spacer layer and the part of the first conformal spacer layer which are vertically stacked and disposed in the interval between the support feature and the covering layer are removed by the second process.

2. The manufacturing method of claim 1, further comprising: performing a trimming process to reduce a size of each of the support features before the step of forming the first conformal spacer layer.

3. The manufacturing method of claim 1, wherein the first process comprises an etching process or/and a chemical mechanical polishing (CMP) process.

4. The manufacturing method of claim 1, wherein after the second process, a part of the first conformal spacer layer and a part of the second conformal spacer layer are remained between the covering layer and the substrate in the vertical direction.

5. The manufacturing method of claim 4, further comprising: after the second process, performing an etching process toward the substrate by using the first conformal spacer layer, the covering layer and the second conformal spacer layer between the covering layer and the substrate in the vertical direction as a mask.

6. The manufacturing method of claim 1, further comprising: before the step of forming the covering layer, performing a first treatment on an upper surface of the second conformal spacer layer so as to form a first treated region in the second conformal spacer layer.

7. The manufacturing method of claim 6, wherein an etching rate of the first treated region in the second conformal spacer layer is lower than an etching rate of the other parts of the second conformal spacer layer in the second process, and a part of the first treated region is remained between the covering layer and the substrate in the vertical direction after the second process.

8. The manufacturing method of claim 6, wherein the first treatment comprises a thermal treatment, a plasma treatment, or a doping treatment.

9. The manufacturing method of claim 1, wherein the substrate comprises a semiconductor substrate, a bottom mask layer, and an etching stop layer stacked in a vertical direction.

10. The manufacturing method of claim 1, wherein after the first process and before the second process, the first conformal spacer layer in the gap comprises a first U-shaped spacer layer, and the second conformal spacer layer in the gap comprises a second U-shaped spacer layer.

11. The manufacturing method of claim 10, wherein the second U-shaped spacer layer is formed between the covering layer and the first U-shaped spacer layer in the gap.

12. The manufacturing method of claim 1, wherein a thickness of the first conformal spacer layer is equal to a thickness of the second conformal spacer layer.

13. The manufacturing method of claim 1, wherein the first process comprises an etching back process, and the etching back process is configured to remove a part of the covering layer so as to expose a part of the second conformal spacer layer.

* * * * *